(12) United States Patent
Ramsbey et al.

(10) Patent No.: US 6,900,085 B2
(45) Date of Patent: May 31, 2005

(54) ESD IMPLANT FOLLOWING SPACER DEPOSITION

(75) Inventors: Mark T. Ramsbey, Sunnyvale, CA (US); Michael Fliesler, Santa Cruz, CA (US); Mark Randolph, San Jose, CA (US); Mimi Qian, Campbell, CA (US); Yu Sun, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/891,885

(22) Filed: Jun. 26, 2001

(65) Prior Publication Data

US 2002/0195663 A1 Dec. 26, 2002

(51) Int. Cl.⁷ ......................................... H01L 21/8234
(52) U.S. Cl. ..................... 438/197; 438/210; 438/199; 438/301; 438/224; 438/231
(58) Field of Search ................................ 438/197, 210, 438/199, 301, 218, 231, 413, 224, 232, 258; 257/355, 356

(56) References Cited

U.S. PATENT DOCUMENTS

| 4,957,873 | A | * | 9/1990 | Ojha et al. | .................. 438/440 |
| 4,987,465 | A | | 1/1991 | Longcor et al. | ......... 357/23.13 |
| 5,168,334 | A | | 12/1992 | Mitchell et al. | ............ 257/324 |
| 5,361,185 | A | | 11/1994 | Yu | ............................. 361/111 |

(Continued)

OTHER PUBLICATIONS

Carlos H. Diaz, Thomas E. Kopley, and Paul J. Marcoux, "Building–In ESD/E#OS Reliability for Sub–Half Micron CMOS Processes," IEEE Trans. on Electron Devices, vol. 43, No. 6, (1996), pp. 991–999.*

Carlos H. Diaz, Thomas E. Kopley, and Paul J. Marcoux, "Building–in ESD/EOS Reliability for Sub–Halfmicron CMOS Processes," IEEE Trans. Electr. Devices, vol. 43, (Jun., 1996) pp. 991–999.*

Carlos H. Diaz, Thomas E. Kopley, and Paul J. Marcoux, "Building–in ESD/EOS Reliability for Sub–Half Micron CMOS Processes," Proc. 33$^{rd}$ Reliability Physics Symp., Apr. 4–6, 1995, IEEE, pp. 276–283.*

Syd R. Wilson, Clarence J. Tracy, and John L. Freeman, Jr., "Handbook of Multilevel Metallization for Integrated Circuits," Noyes Publ., Westwood, New Jersey, (1993), pp. 860–873.*

Syd R. Wilson, Clarence J. Tracy, and John L. Freeman, Jr., "Handbook of Multilevel Metallization for Integrated Circuits," Noyes Publ., Westwood, New Jersey, (1993) pp. 860–873.*

Primary Examiner—Eddie Lee
Assistant Examiner—Thomas Magee
(74) Attorney, Agent, or Firm—Amin & Turocy, LLP

(57) ABSTRACT

One aspect of the present invention provides a process for forming IC devices with ESD protection transistors. According to one aspect of the invention, an ESD protection transistor is provided with a light doping and then, after forming spacers, a heavy doping. The heavy doping with spacers in place can lower the sheet resistance, enhance the bipolar effect for the transistor, reduce the transistor's capacitance, and reduce the junction breakdown voltage, all without causing short channel effects. The invention thereby provides ESD protection transistors that are compact, highly sensitive, and fast-switching. The spacers can be formed at the same time as spacers for other transistors, such as other transistors in a peripheral region of the device.

20 Claims, 4 Drawing Sheets

U.S. PATENT DOCUMENTS

| | | | | |
|---|---|---|---|---|
| 5,378,649 A | * | 1/1995 | Huang | 437/52 |
| 5,426,322 A | | 6/1995 | Shiota | 257/355 |
| 5,814,864 A | | 9/1998 | Liu | 257/355 |
| 5,895,955 A | | 4/1999 | Gardner et al. | 257/336 |
| 5,953,601 A | * | 9/1999 | Shiue et al. | 438/200 |
| 5,966,603 A | | 10/1999 | Eitan | 438/258 |
| 5,991,134 A | | 11/1999 | Tan et al. | 361/56 |
| 6,008,081 A | * | 12/1999 | Wu | 438/210 |
| 6,030,871 A | | 2/2000 | Eitan | 438/276 |
| 6,133,078 A | | 10/2000 | Yun | 438/200 |
| 6,137,718 A | * | 10/2000 | Reisinger | 365/185.03 |
| 6,177,324 B1 | | 1/2001 | Song et al. | 438/307 |
| 6,184,556 B1 | | 2/2001 | Yamazaki et al. | 257/354 |
| 6,187,619 B1 | | 2/2001 | Wu | 438/224 |
| 6,238,975 B1 | * | 5/2001 | Fliesler et al. | 438/258 |
| 6,355,962 B1 | * | 3/2002 | Liang et al. | 257/369 |
| 6,445,617 B1 | * | 9/2002 | Sakakibara | 365/185.22 |
| 6,448,593 B1 | * | 9/2002 | Higashitani et al. | 257/288 |
| 6,667,511 B1 | * | 12/2003 | Fang | 257/321 |

* cited by examiner

ESD IMPLANT FOLLOWING SPACER DEPOSITION

FIELD OF THE INVENTION

The present invention generally relates to semiconductor devices and, more particularly, relates to electrostatic discharge protection transistors for integrated circuits.

BACKGROUND OF THE INVENTION

Electro-static discharge (ESD) or electrical overstress (EOS) is a significant problem in integrated circuit design, especially for devices with high pin counts and circuit speeds. ESD refers to the phenomena wherein a high energy electrical discharge of current is produced at the input and/or output nodes of an integrated circuit (IC) device as a consequence of static charge build-up on the IC package. The static charge build up can result from handling of the IC device by a human body or from handling by IC device manufacturing equipment. Electrostatic discharge has the potential to disable or destroy an entire device, at worst, and to decrease the device's reliability at best.

In general, smaller scale metal oxide semiconductor (MOS) devices with thinner gate oxides are more sensitive to ESD than larger scale devices with thicker oxides. For MOS devices having 1 micron or smaller geometries, discharges of approximately 1.5 amperes can damage or even destroy gates if adequate ESD protection is not provided. Modern flash memory devices with small cell sizes, including traditional floating gate and SONOS memory devices, are highly vulnerable to ESD and require sensitive and fast acting ESD protection circuits.

A variety of ESD protection circuits are available. These circuits can be based on small diodes, Zener diodes, bipolar junction transistors, and/or field effect transistors (FETs). The circuits can be connected between input or output pins and Vcc or Vss power supply pins. Power supply clamps, such as Vcc/Vss clamp structures, are also available. However, there remains an unsatisfied need for more sensitive and faster responding ESD circuits.

SUMMARY OF THE INVENTION

The following presents a simplified summary of the invention in order to provide a basic understanding of some of its aspects. This summary is not an extensive overview of the invention and is intended neither to identify key or critical elements of the invention nor to delineate its scope. The sole purpose of this summary is to present some concepts of the invention in a simplified form as a prelude to the more detailed description that is presented later.

One aspect of the present invention provides a process for forming IC devices with ESD protection transistors. According to one aspect of the invention, an ESD protection transistor is provided with a light doping and then, after forming spacers, a heavy doping. The heavy doping with spacers in place can lower the sheet resistance, enhance the bipolar effect for the transistor, reduce the transistor's capacitance, and reduce the junction breakdown voltage, all without causing short channel effects. The invention thereby provides ESD protection transistors that are compact, highly sensitive, and fast-switching. The spacers can be formed at the same time as spacers for other transistors, such as other transistors in a peripheral region of the device. According to another aspect of the invention, the number of processing steps is reduced by providing the heavy ESD protection transistor implant without masking other transistors of the same type (n-channel or p-channel).

Other advantages and novel features of the invention will become apparent from the following detailed description of the invention and the accompanying drawings. The detailed description and drawings provide certain illustrative examples of the invention. These examples are indicative of but a few of the various ways in which the principles of the invention can be employed.

DETAILED DESCRIPTION OF THE INVENTION

The present invention involves a process for fabricating IC devices. The IC devices typically include core and peripheral regions. For example, the IC devices can be non-volatile memory devices with core memory cells and peripheral region gates for selectively addressing the core memory cells. The IC devices include ESD protection and other transistors. The ESD protection transistors are MOSFETs with source and drain regions that include lightly doped regions immediately adjacent the channel and heavily doped regions spaced apart from the channel. The heavily doped regions can be spaced apart from the channel by employing spacers formed simultaneously with spacers used in doping source and drain regions of other MOSFETs of the IC device. The heavily doped regions around the ESD protection transistors can be employed to lower sheet resistance, lower junction break down, and/or increase the bipolar effect, without causing short channel effects.

The IC devices can be, for example, memory devices or logic devices. Memory devices can be, for example, electrically erasable programmable memory devices, such as flash memory devices. Flash memory devices can have floating gates or can be of SONOS type. The memory structure can be NAND or NOR and can be a virtual ground array with buried bit lines. The invention is particularly well suited for use in manufacturing very small scale MOS devices, such as the foregoing nonvolatile memory devices, with ESD protection.

Figure 1:
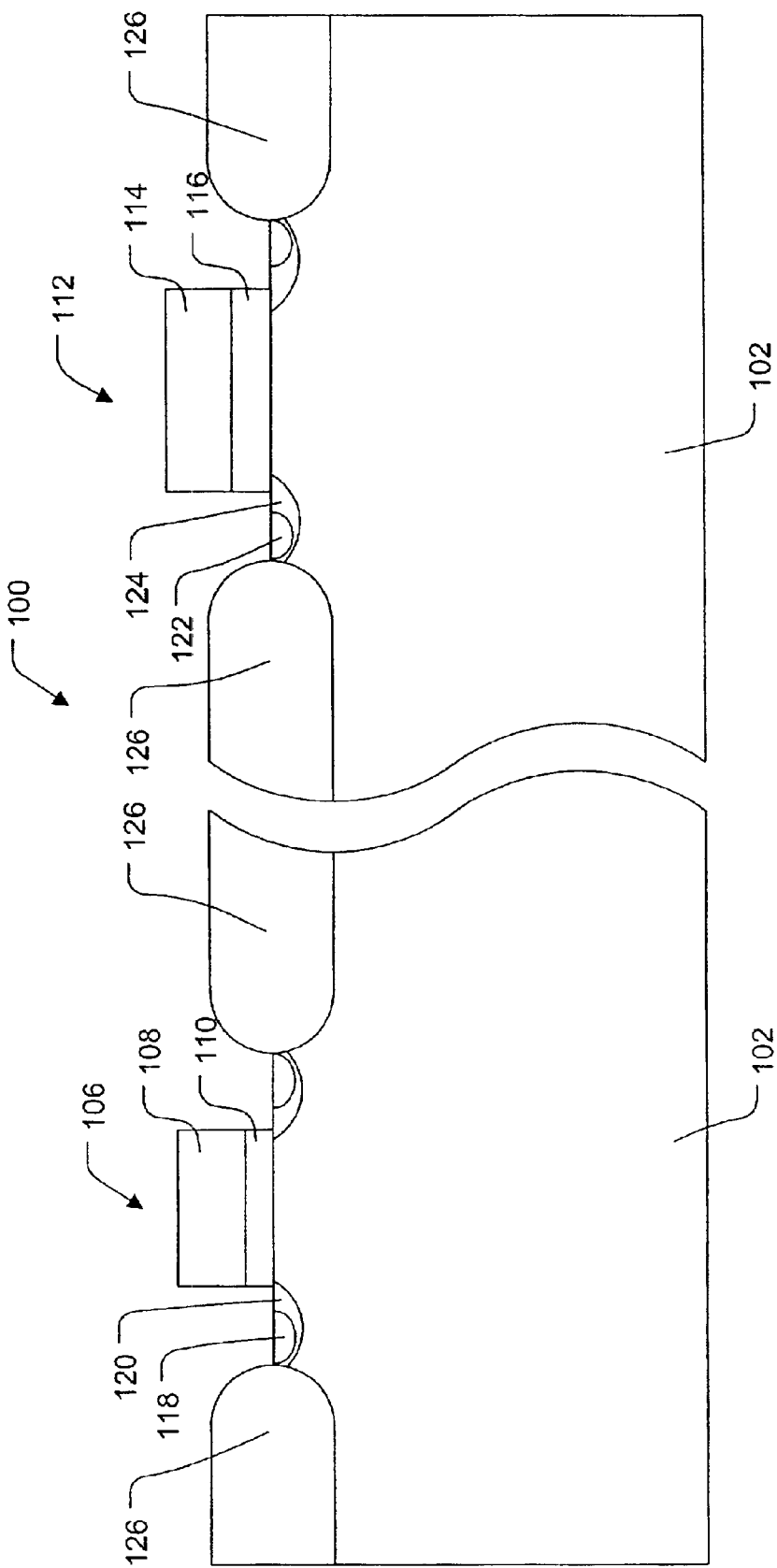
FIG. 1 is a schematic illustration of an integrated circuit with an ESD protection transistor according to one aspect of the present invention.

The present invention is now described with reference to the figures, wherein like features are referred to with like numbers throughout. FIG. 1 schematically illustrates a portion of the peripheral region of an IC device 100 according to one aspect of the present invention. IC device 100 comprises isolation regions 126, transistor 106, and ESD protection transistor 112 on substrate 102. Substrate 102 comprises a semiconductor such as Si, GaAs, or InP. For example, the substrate can be a silicon wafer or silicon on insulator (SOI). The semiconductor can be doped n-type or p-type. The doping can include multiple layers or wells.

Transistor 106 includes an insulating layer 110, which is generally an oxide, and a poly layer 108. A poly layer is a layer containing amorphous silicon or polysilicon. Source and drain regions adjacent transistor 106 include lightly doped regions 120 and heavily doped regions 118. Transistor 106 can be n-channel or p-channel. IC device 100 may have both n-channel and p-channel transistors.

ESD protection transistor 112 includes an insulating layer 116, which is generally an oxide, and a poly layer 114. Poly layers 108 and 114 are generally formed at the same time. On the other hand, insulating layers 110 and 116 often have different thicknesses. In one aspect of the invention, the thicknesses of insulating layer 116 is in the range from about 30 to about 500 Å. In another aspect of the invention, the thicknesses of insulating layer 116 is in the range from about 50 to about 120 Å. In a further aspect of the invention, the thicknesses of insulating layer 116 is in the range from about 60 to about 100 Å.

Source and drain regions adjacent ESD protection transistor 112 include lightly doped (LDD) regions 124 and heavily doped regions 122. Symmetric source and drain regions are illustrated, however, the invention extends to devices having ESD protection transistors with asymmetric source and drain regions. ESD protection transistor 112 is generally a p-channel transistor, but it can also be n-channel.

There are generally differences in the dopant concentrations among ESD protection transistor 112 and other transistors of IC device 100, such as transistor 106, particularly with respect to the dopant concentrations of heavy doped regions adjacent the transistors. However, the spacing of the heavily doped regions from the channels of the transistors generally provides evidence that heavy doping took place with spacers in place and that the spacers for the different types of transistors were formed simultaneously.

The channel length of ESD protection transistor 112 can be relatively small. In one aspect of the invention, the channel length is less than or equal to about 1.0 $\mu$m. In another aspect of the invention, the channel length is less than or equal to about 0.25 $\mu$m. In a further aspect of the invention, the channel length is less than or equal to than about 0.15 $\mu$m.

Substrate 102, at least in the channel region of ESD device 112, is generally implanted to set the threshold voltage ($V_T$). The implant can be light (n– or p–) or heavy (n+ or p+). Examples of suitable dopants include one or more of arsenic, boron, and phosphorus. The doping can involve several layers or wells. Generally, the uppermost well is p-type.

LDD regions 124 are generally doped n-type, with arsenic or phosphorus, for example. In one aspect of the invention, LDD regions 124 are doped to a concentration of about $1\times10^{15}$ to about $5\times10^{18}$ atoms per cm$^3$. In another aspect of the invention, LDD regions 124 are doped to a concentration of about $3\times10^{15}$ to about $1\times10^{18}$ atoms per cm$^3$. In a further aspect of the invention, LDD regions 124 are doped to a concentration of about $1\times10^{16}$ to about $5\times10^{17}$ atoms per cm$^3$.

Heavily doped regions 122 are generally doped n-type as well. In one aspect of the invention, heavily doped regions 122 are doped to a concentration of about $1\times10^{17}$ to about $1\times10^{21}$ atoms per cm$^3$. In another aspect of the invention, heavily doped regions 122 are doped to a concentration of about $1\times10^{18}$ to about $3\times10^{20}$ atoms per cm$^3$. In a further aspect of the invention, heavily doped regions 122 are doped to a concentration of about $5\times10^{18}$ to about $1\times10^{20}$ atoms per cm$^3$.

During an ESD event, a large current flows through IC device 100. When the voltage applied to the drain of ESD device 112 exceeds a critical value, current flows through ESD device 112, at first by avalanche breakdown. Subsequently, the mechanism shifts to low impedance bipolar operation, whereby a large current can flow with a low voltage.

Figure 2:
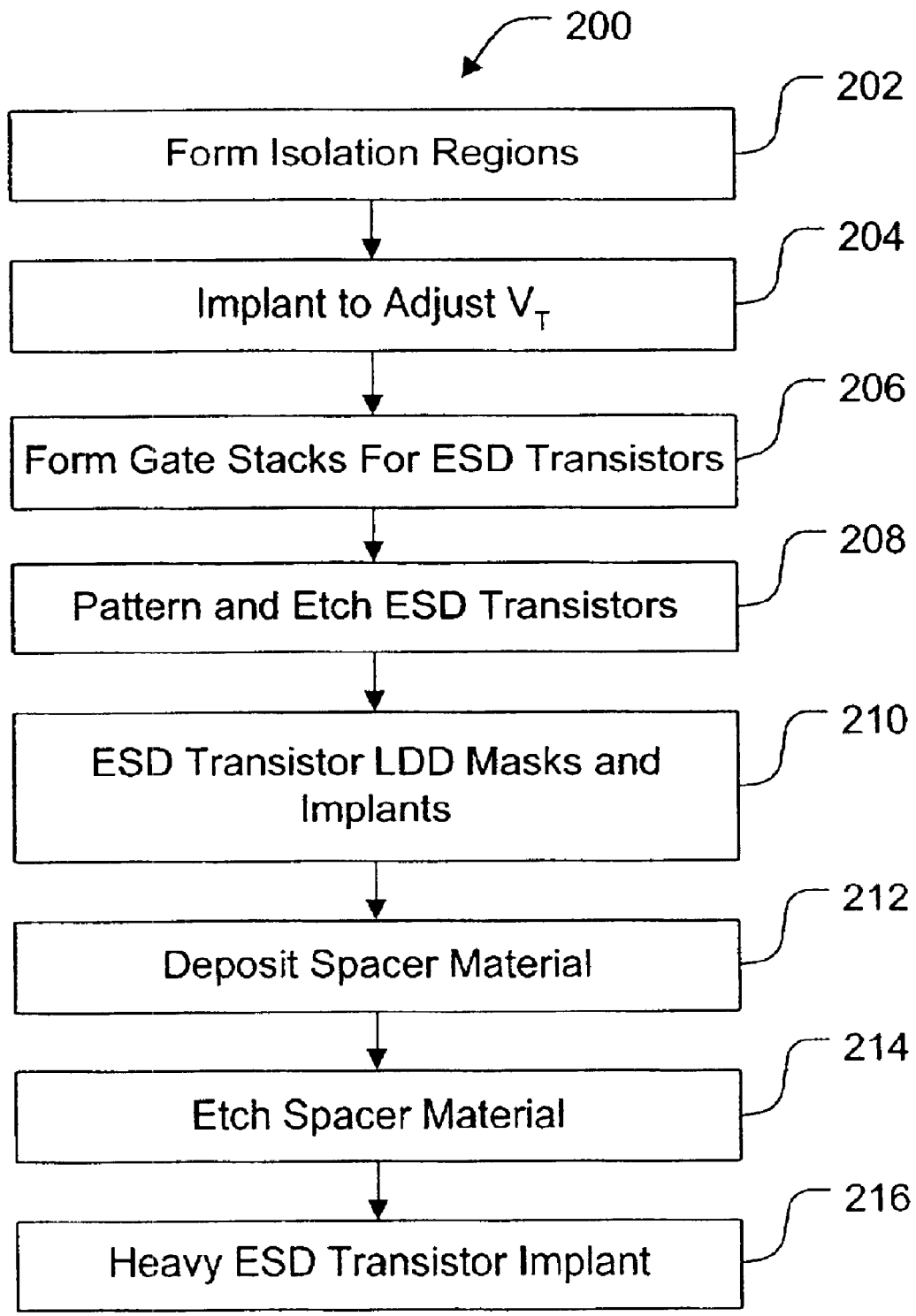
FIG. 2 illustrates a flow chart of a process according to another aspect of the present invention.

FIG. 2 provides a flow chart showing certain actions in a process 200 in accordance with another aspect of the invention, which can be employed to produce IC device 100. Act 202 is forming isolation regions. These isolation regions include a dielectric material, usually an oxide, and are generally distributed in a grid pattern across the semiconductor substrate. In one aspect of the invention, the isolation regions are from about 50 nm to about 5000 nm thick. In another aspect of the invention, the isolation regions are from about 100 nm to about 1000 nm thick. In a further aspect of the invention, the isolation regions are from about 250 nm to about 650 nm thick.

The isolation regions can be formed by any suitable method, including LOCOS (local oxidation of silicon) and STI (shallow trench isolation) processes. In both processes, the substrate is first masked leaving only the future sites for the isolation regions exposed. In the LOCOS process, the substrate is heated in the presence of an oxidizing gas, such as air, whereby oxide grows on the exposed regions. In the STI process, the exposed substrate is etched away, forming trenches. The trenches are then filled with a dielectric material such as an oxide and/or a nitride. For example, the trenches may be filled by CVD depositing tetraethyl orthosilicate (TEOS). There generally follows an etching step where the surface is planarized, whereby dielectric outside the trenches is removed. A LOCOS process can also be combined with an STI process to form trenches coated with oxide.

Act 204 is implanting channel regions for ESD protection transistors to set the threshold voltage ($V_T$). Channel regions for other transistors can also be implanted at this time. The channel regions of the ESD protection transistors can be doped lightly (n– or p–) or heavily (n+ or p+). Examples of suitable dopants include one or more of arsenic, boron, and phosphorus. The doping can comprise several layers or wells. Generally, the uppermost well is made p-type. For example, boron can be implanted to a dosage of about $1\times10^{11}$ atoms per cm$^2$ to about $1\times10^{13}$ atoms per cm$^2$. The implant can be carried out with an energy of about 10 kev to about 300 keV. In one aspect of the invention, the channel regions are doped to a concentration of about $1\times10^{16}$ to about $1\times10^{21}$ atoms per cm$^3$. In another aspect of the invention, the channel regions are doped to a concentration of about $1\times10^{19}$ to about $3\times10^{20}$ atoms per cm$^3$. In a further aspect of the invention, the channel regions are doped to a concentration of about $5\times10^{19}$ to about $1\times10^{20}$ atoms per cm$^3$.

Figure 3:
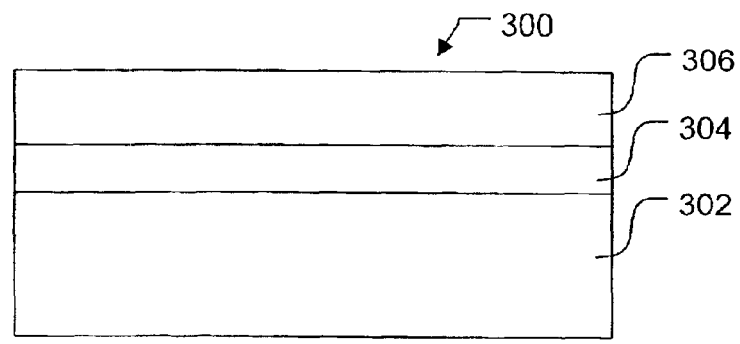
FIG. 3 is a schematic illustration of a gate stack for ESD protection transistors.

Subsequently, transistor gate stacks are formed. These include ESD and non-ESD protection transistor gate stacks. FIG. 3 illustrates an ESD protection transistor gate stack, which includes gate oxide layer 304 and poly layer 306 formed over semiconductor substrate 302. Gate stacks in the core generally have thinner gate oxides than gate stacks in the peripheral region. Aside from gate oxide layer 304, two oxide thicknesses are often employed in the periphery, one for low voltage gates and another for high voltage gates. For example, the peripheral region can comprise low voltage gates with gate oxides from about 50 Å to about 150 Å thick and high voltage gates with gate oxides from about 150 Å to about 400 Å thick. All gate oxides are typically grown in part at the same time. Additional oxidation steps are employed where greater thickness of gate oxide is required.

Gate oxides can be formed by any suitable processes including chemical vapor deposition (CVD), dry oxidation, wet oxidation, or thermal oxidation. For example, the gate oxide layer 304 can be formed by dry oxidation at temperatures over about 900° C. in an atmosphere comprising oxygen, HCl and argon.

The poly layer 306 contains amorphous silicon or polysilicon. Poly layer 306 can be shared by all transistors in the periphery. In one aspect of the invention, the poly layer has a thickness from about 500 Å to about 6,000 Å. In another aspect of the invention, the poly layer has a thickness from about 750 Å to about 3,000 Å. In a further aspect of the invention, the poly layer has a thickness from about 1,000 Å to about 2,000 Å. The poly layer can be formed by any suitable means. For example, an amorphous silicon layer can be deposited via CVD at 530° C. and 400 mTorr with a gas containing $SiH_4$ and helium.

Where the core region contains memory cells, a memory cell stack in the core region can be formed around the same time as gate stacks for ESD protection transistors and other transistors of the peripheral region. The memory cell stack can be a conventional floating gate stack, including a gate oxide, a polysilicon or amorphous silicon floating gate, a multi-layer dielectric, and a poly layer.

The memory cell stack can also be a SONOS type memory cell stack. A SONOS memory cell stack includes a charge trapping dielectric under a poly layer. The charge trapping dielectric can be any layer or layers that are capable of, or facilitate, electron trapping. For example, charge trapping dielectrics include an ONO trilayer dielectric, an oxide/nitride bilayer dielectric, a nitride/oxide bilayer dielectric, an oxide/tantalum oxide bilayer dielectric ($SiO_2/Ta_2O_5$), an oxide/tantalum oxide/oxide trilayer dielectric ($SiO_2/Ta_2O_5/SiO_2$), an oxide/strontium titanate bilayer dielectric ($SiO_2/SrTiO_3$), an oxide/barium strontium titanate bilayer dielectric ($SiO_2/BaSrTiO_2$), an oxide/strontium titanate/oxide trilayer dielectric ($SiO_2/SrTiO_3/SiO_2$), an oxide/strontium titanate/barium strontium titanate trilayer dielectric ($SiO_2/SrTiO_3/BaSrTiO_2$), and the like (in each case, the first layer mentioned is the bottom layer while the last layer mentioned is the top layer). Although the term SONOS is suggestive of an ONO layer, as used herein the term encompasses nonvolatile memory devices containing any of the charge trapping dielectrics described above. In other words, a SONOS type nonvolatile memory device contains any dielectric layer or layers that are capable of or facilitate electron trapping, and does not require an ONO charge trapping dielectric.

Where the charge trapping dielectric is an ONO dielectric, one or both of the silicon dioxide layers can be a silicon-rich silicon dioxide layer. One or both of the silicon dioxide layers can also be an oxygen-rich silicon dioxide layer. One or both of the silicon dioxide layers can be a thermally grown or a deposited oxide. One or both of the silicon dioxide layers can be nitrided oxide layers. A nitride layer can be a silicon-rich silicon nitride layer or a silicon nitride containing oxygen. The nitride can also be a nitrogen-rich silicon nitride layer.

Figure 4:
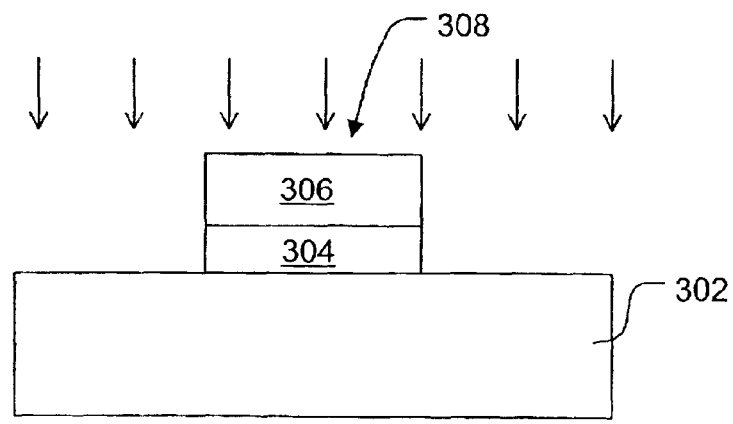
FIG. 4 is a schematic illustration of the gate stack of FIG. 3 after patterning to form a transistor.

The ESD protection transistors are formed in act 208 by patterning layers 304 and 306. A patterned ESD protection transistor 308 is illustrated in FIG. 4. Other IC device components can also be patterned at this time. Patterning can be carried out with any suitable method, including, for example, a lithographic process.

In the case of a memory device, patterning is also employed to divide the poly layer of the core region into word lines. Source/drain regions, forming buried bit lines, can occupy spaces between word lines in the finished device. In one aspect of the invention, the spacing between word lines, except where contacts are placed, is from about 0.15 μm to about 1.5 μm. In another aspect of the invention, spacing between word lines is from about 0.18 μm to about 1 μm. In a further aspect of the invention, the spacing between word lines from about 0.2 μm to about 0.75 μm. The widths of the word lines are comparable to the spaces between word lines.

Figure 5:
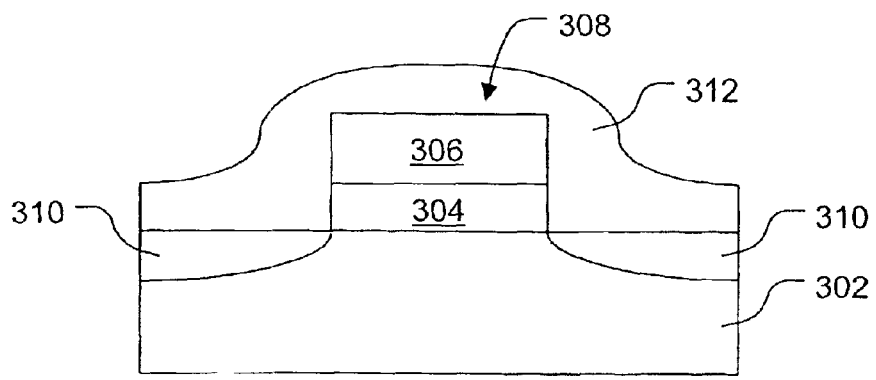
FIG. 5 is a schematic illustration of the transistor of FIG. 4 after LDD doping and depositing a spacer material.

Act 210 involves one or more LDD doping processes, which are applied at least in the periphery and to at least the ESD protection transistors. FIG. 4 illustrates an LDD doping process, which results in lightly doped regions 310 as illustrated in FIG. 5. During this process, other transistors or sections of the device can be masked, if necessary or desired. There can be several LDD doping steps, wherein n-channel and p-channel transistors are masked and implanted separately. Act 210 provides an implantation for ESD protection transistors at a dosage, for example, of about $1\times10^{11}$ atoms/$cm^2$ to about $1\times10^{14}$ atoms/$cm^2$ at an energy of about 20 keV to about 80 keV. Suitable dopants can include, for example, arsenic, boron, or phosphorus.

Act 212 is depositing a spacer material, such as the coating of spacer material 312 over device 308 illustrated in FIG. 5. Any suitable material can be used, including a nitride and/or an oxide, for example. An oxide layer can be formed by depositing than oxidizing TEOS. Using CVD techniques, a nitride layer can also be deposited. The spacer material is deposited at least over the ESD protection transistors, and generally over other transistors as well.

Figure 6:
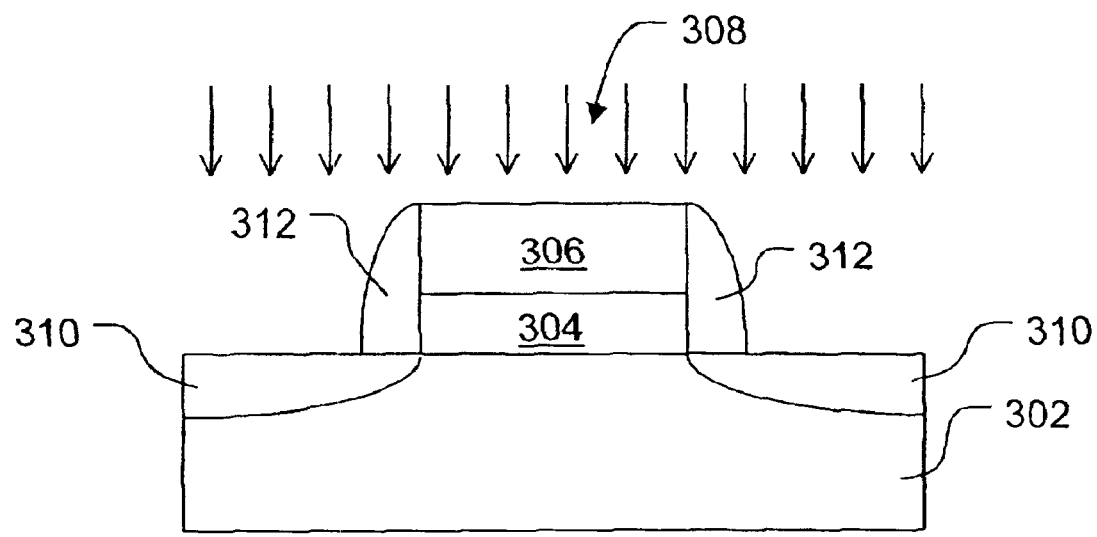
FIG. 6 is a schematic illustration of the transistor of FIG. 4 after the spacer material has been etched.

The spacer material is etched in act 214. Any suitable etching process can be used that leaves a comparatively thick layer of spacer material to the sides of the ESD protection transistors. The etching is usually an anisotropic etching process, such as reactive ion etching. Choice of a suitable process and reagents depends on the spacer material. Reactive ion etching of an oxide spacer can be carried out with $CF_4$, for example. FIG. 6 illustrates spacers 312 formed by anisotropically etching spacer material 312.

Figure 7:
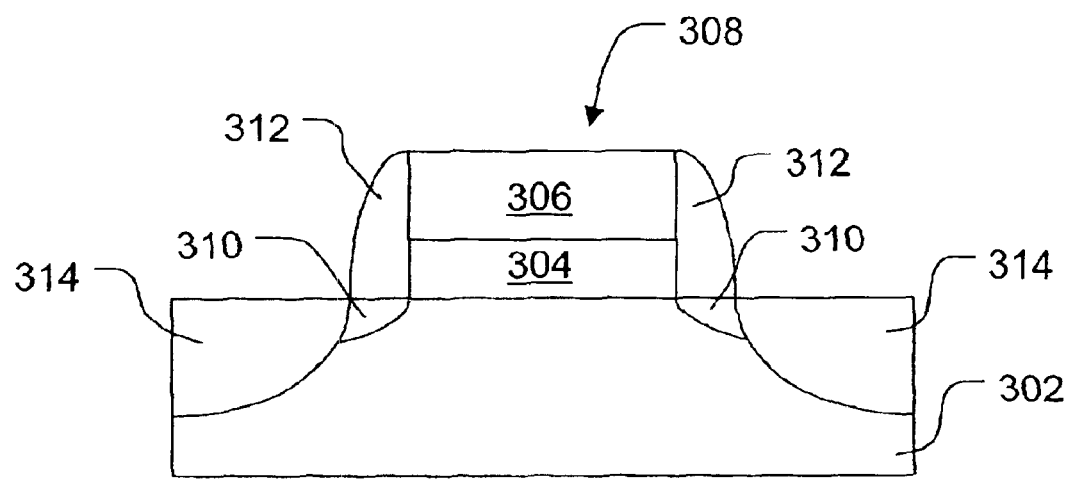
FIG. 7 is a schematic illustration of the transistor of FIG. 4 after a heavy dopant implant.

Act 216 is heavily doping source and drain regions for ESD protection transistors, as illustrated in FIG. 6. The spacers limit doping immediately adjacent the ESD protection transistors, whereby the resulting heavily doped regions 314 are spaced apart from the channel region of ESD protection transistor 308, as illustrated in FIG. 7. In one aspect of the invention, the dopants are implanted to a dosage from about $1\times10^{14}$ to about $1\times10^{16}$ atoms/$cm^2$. In another aspect of the invention, the dopants are implanted to a dosage from about $5\times1^{14}$ to about $7\times10^{15}$ atoms/$cm^2$. In a further aspect of the invention, the dopants are implanted to a dosage from about $1\times10^{15}$ to about $5\times10^{15}$ atoms/$cm^2$. Suitable energies are, for example, in the range from about 60 keV to about 100 keV.

Transistors other than ESD protection transistors may or may not be masked during the act 216. In one aspect of the invention, however, non-ESD protection transistors of the same type (n-channel or p-channel) as the ESD protection transistors are unmasked during act 216. The spacers prevent the heavy doping from causing a short channel effect in the non-ESD protection transistors.

Further processing is performed to complete the fabrication of the IC device. Although the invention has been shown and described with respect to a certain preferred embodiment or embodiments, it is obvious that equivalent alterations and modifications will occur to those skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application

What is claimed is:

1. A method of forming non-volatile semiconductor memory device, comprising:

providing a semiconductor substrate having a core region comprising memory cells and a peripheral region, wherein word lines in the core region connecting the memory cells are spaced apart by about 1 $\mu$m or less;

forming one or more insulating layers for one or more electrostatic discharge protection transistors and one or more other transistors in the peripheral region;

forming a poly layer over the insulating layers;

patterning electrostatic discharge protection transistors and other transistors from the insulating layers and the poly layer;

depositing spacer material over the electrostatic discharge protection transistors and the other transistors;

etching the spacer material to form spacers; and with the spacers in place and without masking the other transistors, heavily doping source and drain regions for the electrostatic discharge protection transistors to provide channel lengths for the electrostatic protection transistors of about 1 $\mu$m or less.

2. The method of claim 1, wherein heavily doping source and drain regions involves implanting with one of arsenic and phosphorus at about $5 \times 10^{14}$ atoms/cm$^2$ to about $7 \times 10^{15}$ atoms/cm$^2$ at an energy from about 60 keV to about 100 keV.

3. The method of claim 1, wherein the non-volatile semiconductor memory device is a SONOS type flash memory device.

4. The method of claim 3, wherein the flash memory device comprises a virtual ground array structure and SONOS type memory cells.

5. The method of claim 1, wherein heavily doping source and drain regions involves implanting with one of arsenic and phosphorus at about $1 \times 10^{14}$ atoms/cm$^2$ to about $1 \times 10^{16}$ atoms/cm$^2$ at an energy from about 60 keV to about 100 keV.

6. A method of forming non-volatile semiconductor memory device, comprising:

providing a semiconductor substrate having a core region comprising memory cells and a peripheral region, wherein word lines in the core region connecting the memory cells are spaced apart by about 1 $\mu$m or less;

forming one or more insulating layers for one or more electrostatic discharge protection transistors and one or more other transistors in the peripheral region;

forming a poly layer over the insulating layers;

patterning electrostatic discharge protection transistors and other transistors from the insulating layers and the poly layer;

lightly doping source and drain regions for the electrostatic discharge protection transistors with one of arsenic, boron, and phosphorus at about $1 \times 10^{11}$ atoms/cm$^2$ to about $1 \times 10^{14}$ atoms/cm$^2$ at an energy from about 20 keV to about 80 keV;

depositing spacer material over the electrostatic discharge protection transistors and the other transistors;

etching the spacer material to form spacers; and with the spacers in place and without masking the other transistors, heavily doping source and drain regions for the electrostatic discharge protection transistors with one of arsenic and phosphorus at about $1 \times 10^{14}$ atoms/cm$^2$ to about $1 \times 10^{16}$ atoms/cm$^2$ at an energy from about 60 keV to about 100 keV to provide channel lengths for the electrostatic protection transistors of about 0.25 $\mu$m or less.

7. A method of forming non-volatile semiconductor memory device, comprising:

providing a semiconductor substrate having a core region comprising memory cells and a peripheral region, wherein word lines in the core region connecting the memory cells are spaced apart by about 1 $\mu$m or less;

forming one or more insulating layers for one or more electrostatic discharge protection transistors and one or more other transistors in the peripheral region;

forming a poly layer over the insulating layers;

patterning electrostatic discharge protection transistors and other transistors from the insulating layers and the poly layer;

lightly doping source and drain regions for the electrostatic discharge protection transistors with one of arsenic, boron, and phosphorus at about $1 \times 10^{11}$ atoms/cm$^2$ to about $1 \times 10^{14}$ atoms/cm$^2$ at an energy from about 20 keV to about 80 keV;

depositing spacer material over the electrostatic discharge protection transistors and the other transistors;

etching the spacer material to form spacers; and with the spacers in place and without masking the other transistors, heavily doping source and drain regions for the electrostatic discharge protection transistors with one of arsenic and phosphorus at about $5 \times 10^{14}$ atoms/cm$^2$ to about $7 \times 10^{15}$ atoms/cm$^2$ at an energy from about 60 keV to about 100 keV to provide channel lengths for the electrostatic protection transistors of about 0.25 $\mu$m or less.

8. The method of claim 1, wherein the channel lengths of the electrostatic protection transistors are about 0.25 $\mu$m or less.

9. The method of claim 1, wherein the channel lengths of the electrostatic protection transistors are about 0.15 $\mu$m or less.

10. The method of claim 1, wherein the word lines in the core region connecting the memory cells are spaced apart by about 0.2 $\mu$m to about 0.75 $\mu$m.

11. The method of claim 2, wherein heavily doping source and drain regions for the electrostatic discharge protection transistors comprises doping with arsenic.

12. The method of claim 2, wherein heavily doping source and drain regions for the electrostatic discharge protection transistors comprises doping with phosphorus.

13. The method of claim 6, wherein the non-volatile semiconductor memory device is a SONOS type flash memory device.

14. The method of claim 6, wherein heavily doping source and drain regions for the electrostatic discharge protection transistors comprises doping with arsenic.

15. The method of claim 6, wherein the channel lengths of the electrostatic protection transistors are about 0.15 µm or less.

16. The method of claim 6, wherein the word lines in the core region connecting the memory cells are spaced apart by about 0.2 µm to about 0.75 µm.

17. The method of claim 7, wherein the non-volatile semiconductor memory device is a SONOS type flash memory device.

18. The method of claim 7, wherein the channel lengths of the electrostatic protection transistors are about 0.15 µm or less.

19. The method of claim 7, wherein the word lines in the core region connecting the memory cells are spaced apart by about 0.2 µm to about 0.75 µm.

20. The method of claim 7, wherein heavily doping source and drain regions for the electrostatic discharge protection transistors comprises doping with phosphorus.

* * * * *